(12) United States Patent
Nashiki et al.

(10) Patent No.: US 9,249,503 B2
(45) Date of Patent: Feb. 2, 2016

(54) METHOD FOR DOUBLE-SIDE VACUUM FILM FORMATION AND LAMINATE OBTAINABLE BY THE METHOD

(75) Inventors: Tomotake Nashiki, Osaka (JP); Yoshimasa Sakata, Osaka (JP); Hideo Sugawara, Osaka (JP); Kenkichi Yagura, Osaka (JP); Akira Hamada, Osaka (JP); Yoshihisa Ito, Osaka (JP); Kuniaki Ishibashi, Osaka (JP)

(73) Assignee: NITTO DENKO CORPORATION, Ibaraki-Shi, Osaka (JP)

( * ) Notice: Subject to any disclaimer, the term of this patent is extended or adjusted under 35 U.S.C. 154(b) by 621 days.

(21) Appl. No.: 13/559,094

(22) Filed: Jul. 26, 2012

(65) Prior Publication Data

US 2013/0029162 A1 Jan. 31, 2013

(30) Foreign Application Priority Data

Jul. 29, 2011 (JP) .................. 2011-166668
Jul. 12, 2012 (JP) .................. 2012-156279

(51) Int. Cl.
 C23C 14/56 (2006.01)
(52) U.S. Cl.
 CPC ....... *C23C 14/562* (2013.01); *Y10T 428/31678* (2015.04)
(58) Field of Classification Search
 CPC .................................................. C23C 14/562
 USPC ............ 428/332; 427/455; 204/298.12, 192.1
 See application file for complete search history.

(56) References Cited

U.S. PATENT DOCUMENTS

| | | | |
|---|---|---|---|
| 3,933,644 A * | 1/1976 | Skinner et al. | 204/298.12 |
| 5,447,748 A | 9/1995 | Kitaori et al. | |
| 2010/0055320 A1 | 3/2010 | Honma | |
| 2010/0055347 A1 | 3/2010 | Kato et al. | |
| 2010/0140078 A1 * | 6/2010 | Pinarbasi et al. | 204/192.1 |

(Continued)

FOREIGN PATENT DOCUMENTS

| | | |
|---|---|---|
| CN | 101908582 A | 12/2010 |
| EP | 0428358 | 5/1991 |

(Continued)

OTHER PUBLICATIONS

European Office Action for 12178227.0 dated Nov. 12, 2012, citing the above reference(s).

(Continued)

*Primary Examiner* — Keith Hendricks
*Assistant Examiner* — Timon Wanga
(74) *Attorney, Agent, or Firm* — Haumptman Ham, LLP

(57) ABSTRACT

The film formation method comprises the steps of: unrolling and feeding an elongated substrate wound in a roll form from a first roll chamber in a first direction from the first roll chamber toward a second roll chamber, using a first surface as a surface for film formation; degassing the substrate fed in the first direction; forming a second material film on the first surface of the substrate in a second film formation chamber; taking up the substrate in a roll form in the second roll chamber, the substrate having the second material film formed thereon; unrolling and feeding the substrate from the second roll chamber in a second direction from the second roll chamber toward the first roll chamber; forming a first material film on the second material film in a first film formation chamber; taking up the substrate in a roll form in the first roll chamber.

14 Claims, 3 Drawing Sheets

(56) References Cited

U.S. PATENT DOCUMENTS

| | | | |
|---|---|---|---|
| 2010/0242842 A1 | 9/2010 | Takeuchi et al. | |
| 2010/0260935 A1 | 10/2010 | Kato et al. | |
| 2010/0261008 A1* | 10/2010 | Kikuchi | 428/332 |
| 2011/0143019 A1 | 6/2011 | Mosso et al. | |
| 2011/0171395 A1* | 7/2011 | Juliano et al. | 427/455 |
| 2012/0276397 A1 | 11/2012 | Nashiki et al. | |

FOREIGN PATENT DOCUMENTS

| | | |
|---|---|---|
| EP | 2518761 | 10/2012 |
| JP | 06116722 A | 4/1994 |
| JP | 7-98854 | 4/1995 |
| JP | 4415584 | 2/2010 |
| JP | 2010236076 | 10/2010 |
| TW | 201026883 A | 7/2010 |
| TW | 201029089 A | 8/2010 |
| TW | 201107502 A | 3/2011 |
| TW | 201109465 A | 3/2011 |
| WO | 2011/049567 | 4/2011 |

OTHER PUBLICATIONS

Taiwanese Office Action for application No. 101127220 dated Oct. 21, 2015, citing the above reference(s).
Chinese Office Action for application No. 201210268890.5 dated Jun. 1, 2015, citing the above reference(s).

* cited by examiner

METHOD FOR DOUBLE-SIDE VACUUM FILM FORMATION AND LAMINATE OBTAINABLE BY THE METHOD

CROSS REFERENCE TO RELATED APPLICATION

This application claims the priority of Japanese Patent Application No. 2011-166668 filed on Jul. 29, 2011 and Japanese Patent Application No. 2012-156279 filed on Jul. 12, 2012 in the JPO (Japan Patent Office), the disclosure of which is incorporated herein in their entirety by reference.

TECHNICAL FIELD

The present invention relates to a method for film formation, and in particular to a method for double-side vacuum film formation capable of subjecting an elongated substrate to vacuum film formation, and a laminate obtainable by the method.

BACKGROUND ART

Various film formation processes, such as a vacuum vapor deposition process, a sputtering process and an ion plating process, have been developed. A laminate obtained by such a film formation process is widely utilized in production of display devices, such as liquid crystal displays or organic LE (Light Emitting) displays, semiconductor devices, etc. In the display devices, the semiconductor devices, etc., the laminate is usable as a protective film, and various types of functional films, such as an optical filter and an anti-reflection film.

Late years, demand for device units using the functional films, such as a LCD (Liquid Crystal Display) TV, a mobile phone and a video game machine, has been rapidly expanded. Along with expansion of the demand, it has become an urgent matter to develop a technique for mass-producing a functional film within a short period of time. In order to respond to this need, a roll-to-roll technique has been developed. The roll-to-roll technique is designed to unroll and feed an elongated substrate wound in a roll form, between two rolls, so as to enable continuous film formation, thereby increasing efficiency of a film formation operation.

One example of a film formation method using a roll-to-roll technique is disclosed in JP 4415584B (Patent Document 1). In this film formation method, one rotary drum is provided between two rolls, and a plurality of targets are arranged with respect to the one rotary drum which is transporting a substrate, to enable continuous film formation, thereby increasing efficiency of the film formation operation.

JP 2010-236076A (Patent Document 2) and JP 07-098854A (Patent Document 3) disclose a film formation method capable of subjecting particularly both sides of a substrate to film formation, using the roll-to-roll technique. In this film formation method, with a view to enabling double-side film formation, two rotary drums and one take-up roll disposed between the rotary drums are used, wherein a substrate fed from a feed roll is subjected to film formation through the two rotary drums which are rotating in respective opposite directions, and then rolled up on the take-up roll.

LIST OF PRIOR ART DOCUMENTS

Patent Documents

Patent Document 1: JP 4415584B
Patent Document 2: JP 2010-236076A
Patent Document 3: JP 07-098854A

SUMMARY OF THE INVENTION

Problem to be Solved by the Invention

A layer structure required for the functional film may vary from device to device to which these functional films are applied, and it may also vary depending on performance required for the functional film. For this reason, it is desired to develop a film formation method capable of producing, for example, a layer structure subjected to vacuum film formation on its both sides in an efficient and low-cost manner using a simple configuration of apparatus.

However, the techniques disclosed in the documents such as the Patent Documents 2 and 3 are capable of forming a film on both sides of a substrate, but do not make it clear in what manner various treatments such as degassing, annealing and film formation are specifically applied in performing the double-side film formation, and do not have a configuration that can flexibly apply these treatments depending on a wide variety of laminate structures. For this reason, these techniques are likely to fail to sufficiently perform heating after completion of film formation, causing a problem that a material of the formed film is fail to be fully crystallized.

Further, in these conventional apparatuses, a target is fixed at a position spaced apart by a predetermined distance with respect to a rotary drum. Thus, in order to perform maintenance on the target etc. supported by a cathode electrode, it is necessary to stop the film formation operation. This causes a problem of deterioration in efficiency of the film formation operation etc.

The present invention has been made to solve the above problems in the conventional techniques, and an object thereof is to provide a film formation method, under the roll-to-roll technique, promoting, in particular, optimization of double-side vacuum film formation and capable of producing a laminate subjected to vacuum film formation on its both sides in an efficient and low-cost manner, by appropriately applying treatments such as heating treatment in a suitable position using a simple configuration of apparatus.

In addition, it is also an object of the present invention to provide a film formation method capable of increasing efficiency of a film formation operation by allowing a cathode electrode requiring maintenance to be removed from a film formation chamber while continuing the required film formation operation.

Means for Solving the Problem

In order to accomplish the above object, according to an aspect of the present invention, there is provided a method for continuously subjecting an elongated substrate to vacuum film formation. The method comprises the steps of: a) unrolling and feeding an elongated substrate wound in a roll form from a first roll chamber in a first direction from the first roll chamber toward a second roll chamber, using a first surface as a surface for film formation; b) degassing the substrate fed in the first direction; c) forming, in a second film formation chamber, a second material film on the first surface of the degassed substrate; d) taking up, in the second roll chamber, the substrate in a roll form, the substrate having the second material film formed thereon; e) unrolling and feeding the substrate taken up in the second roll chamber from the second roll chamber in a second direction from the second roll chamber toward the first roll chamber; f) forming, in a first film formation chamber, a first material film on the second material film formed on the first surface of the substrate fed in the second direction; g) taking up, in the first roll chamber, the substrate in a roll form, the substrate having the first material film laminated on the second material film on the first surface thereof; h) unrolling and feeding the substrate taken up in the first roll chamber from the first roll chamber in the first direction, using a second surface opposite the first surface as a surface for film formation; i) degassing the substrate fed in the first direction; j) forming, in the second film formation chamber, the second material film on the second surface of the degassed substrate; k) taking up, in the second roll chamber, the substrate in a roll form, the substrate having the second material film formed thereon; l) unrolling and feeding the substrate taken up in the second roll chamber from the second roll chamber in the second direction; m) forming, in the first film formation chamber, the first material film on the second material film formed on the second surface of the substrate fed in the second direction; and n) taking up, in the first roll chamber, the substrate in a roll form, the substrate having the first material film laminated on the second material film on both of the first and second surfaces thereof. According to this aspect of the present invention, a laminate comprising the second material film and the first material film respectively laminated in this order on the first surface and the second surface of the substrate is obtained in one apparatus. The first material may be a metal such as copper, copper alloy, silver or silver alloy, and the second material film may be a transparent conducting layer.

In the above method, when unrolling and feeding the substrate from the first roll chamber in the first direction, using a second surface of the substrate as a surface for film formation, the second surface of the substrate may be set as a surface for film formation in a state where a part of the substrate is communicated with a load lock mechanism provided between the first roll chamber and an adjacent chamber to the first roll chamber while shielding between the first roll chamber and the adjacent chamber using the load lock mechanism. This makes it possible to keep all the chambers other than the first roll chamber in a vacuum state during the above operation.

Further, in the above method, the substrate may be subjected to a plasma treatment in a period after it is fed from the first roll chamber and before the second material film is formed thereon. Further, the substrate may be subjected to a plasma treatment in a period after it is fed from the second roll chamber and before the first material film is formed thereon. This makes it possible to strengthen the effect of the plasma treatment.

In the above method, the substrate may be degassed in a heating chamber in a period after it is fed from the first roll chamber and before the second material film is formed thereon. Further, the substrate may be degassed in a heating chamber in a period after it is fed from the second roll chamber and before the first material film is formed thereon. The substrate may be degassed in the first film formation chamber when it is being guided in the first direction. Further, the substrate may be degassed in the second film formation chamber when it is being guided in the second direction. This makes it possible to strengthen the effect of the degassing.

In the above method, when forming, in the second film formation chamber, the second material film on the substrate fed in the first direction, a first cathode electrode in the first film formation chamber may be removed from the first film formation chamber. Further, when forming, in the first film formation chamber, the first material film on the second material film formed on the substrate fed in the second direction, a second cathode electrode in the second film formation chamber may be removed from the second film formation chamber. According to this aspect of the present invention, in one of the first and second film formation chambers, maintenance on the target of a corresponding one of the first and second materials can be performed, while continuously performing a film formation operation in a remaining one of the first and second film formation chambers, so that it becomes possible to increase production efficiency.

In the above method, the substrate may be subjected to an annealing treatment in a period after the second material film is formed and before the first material film is laminated on the first surface thereof, or in a period after the second material film is formed and before the first material film is laminated on the second surface thereof. Further, the substrate may be subjected to an annealing treatment after the first material film is laminated on the second material film on the first surface, or after the first material film is laminated on the second material film on the second surface thereof. This makes it possible to strengthen the effect of annealing treatment.

Effect of the Invention

The present invention makes it possible to provide a film formation method capable of producing a laminate subjected to vacuum film formation on its both sides in an efficient and low-cost manner using a simple apparatus configuration.

DESCRIPTION OF EMBODIMENTS

With reference to the accompanying drawings, a preferred embodiment of the present invention will now be described.

Figure 1:
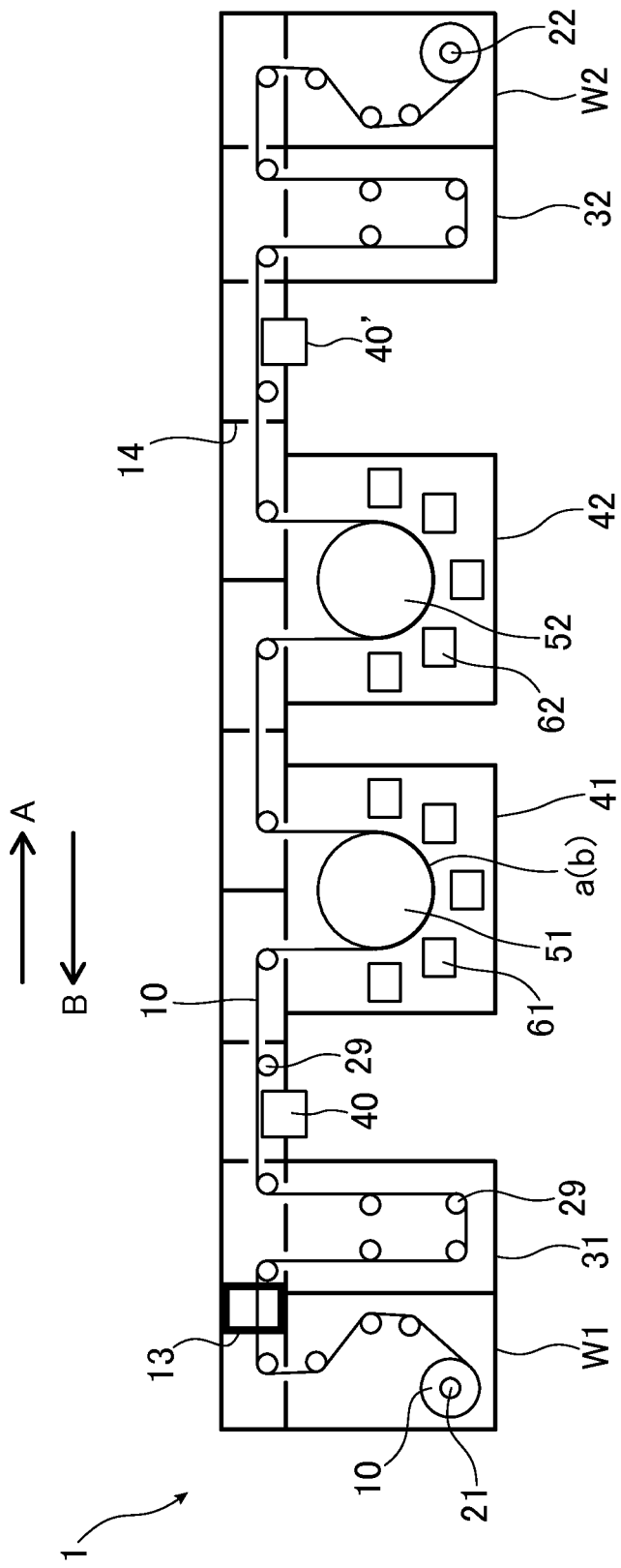
FIG. 1 is a schematic diagram illustrating one example of a film formation apparatus capable of implementing a film formation method according to the present invention.

FIG. 1 illustrates one example of a film formation apparatus 1 capable of implementing the present film formation method. For example, the film formation apparatus 1 comprises: a first roll chamber W1 and a second roll chamber W2 each capable of housing an elongated substrate 10 wound in a roll form; a first film formation chamber 41 and a second film formation chamber 42 each provided between the first roll chamber W1 and the second roll chamber W2; a first heating chamber 31 provided between the first roll chamber W1 and the first film formation chamber 41; a second heating chamber 32 provided between the second film formation chamber 42 and the second roll chamber W2; a plasma treatment device 40 provided between the first heating chamber 31 and the first film formation chamber 41; and a plasma treatment device 40' provided between the second film formation chamber 42 and the second heating chamber 32. To simply present the apparatus configuration, these elements may be positioned in a nearly linear fashion as illustrated. Further, it is only necessary for this apparatus to include the elements capable of implementing the present film formation method, but other elements may also be included. This will be further described below.

The film formation apparatus 1 in FIG. 1 is adaptable to any process such as a vacuum vapor deposition process, a sputtering process, and a chemical vapor deposition (CVD) process. Among them, the sputtering process is capable of achieving large-area uniform deposition and forming a dense thin film, with high continuous productivity and excellent production stability. In the sputtering process, particularly, DC Magnetron Sputtering is capable of forming a magnetic field on a surface of a target to confine electrons near the target so as to suppress damage to a substrate. These treatments are performed with keeping each chamber in a vacuum state.

In order to effectively maintain a vacuum state, a partition 14 is provided between adjacent ones of the chambers of the film formation apparatus 1. Each of the partitions 14 is provided with a slit 13 for allowing the substrate 10 to pass therethrough. Further, in order to effectively maintain the vacuum state of the chambers other than operating space, a load lock mechanism 13 may be provided. The load lock mechanism has been well known, and thus the description thereof will be omitted here.

The substrate 10 to be used in this method may be made of a material allowing a film to be formed thereon, such as one of a wide variety of resin films including a PET film, or one of a wide variety of metal films including an aluminum sheet, and the material is not particularly limited. However, the substrate 10 is formed as a member having a generally elongated shape, and flexibility enough to be wound into a roll form. During film formation, the substrate 10 is fed using an array of guide rollers 29 and others, in a roll-to-roll manner, i.e., between the first roll chamber W1 and the second roll chamber W2, in a first direction A from the first roll chamber W1 toward the second roll chamber W2, or in a second direction B from the second roll chamber W2 toward the first roll chamber W1.

In order to wind the substrate 10 into a roll form, a first feed/take-up roll 21, and a second feed/take-up roll 22 are provided in the first roll chamber W1 and the second roll chamber W2, respectively. When the substrate 10 is fed in the first direction A, the first feed/take-up roll 21 performs an unrolling (feed-out) operation, and the second feed/take-up roll 22 performs a rolling-up (take-up) operation. On the other hand, when the substrate 10 is fed in the second direction B, the second feed/take-up roll 22 performs an unrolling (feed-out) operation, and the first feed/take-up roll 21 performs a rolling-up (take-up) operation.

In the first and second heating chambers 31, 32, the substrate 10 is heated and subjected to treatments such as degassing treatment and annealing treatment. The obtainable effect varies depending on their installation position and a usage mode of the film formation apparatus 1. For example, the heating chamber 31 provided between the first roll chamber W1 and the first film formation chamber 41 can heat and degas the substrate 10 before film formation in the first film formation chamber 41. During a vacuum process or the like, water is likely to come up to a surface from an inside of the substrate 10. In this case, such water has a great impact on a composition of a film to be formed. In the film formation apparatus 1, the heating chamber 31 provided at the above position may remove water to reduce the negative impact.

In addition, the second heating chamber 32 provided between the second film formation chamber 42 and the second roll chamber W2 makes it possible to heat the substrate 10 after subjecting the substrate 10 to film formation in the second film formation chamber 42, thereby annealing a material of a film formed on the substrate 10 to change the atomic arrangement of the film such that crystal grains are regularly arranged. Alternatively or additionally, a heating chamber may be provided, for example, between the first film formation chamber 41 and the second film formation chamber 42, according to need. However, the heating chamber is not necessarily required. For example, a heating function provided by a rotary drum in the film formation chamber may be utilized to obtain the same effect without providing the heating chamber.

The plasma treatment devices 40, 40' are used to subject the substrate 10 to a plasma treatment. The plasma treatment allows a surface of the substrate 10 to be activated and cleaned, thereby allowing the subsequent film formation to be more effectively performed. As with the heating chamber, an installation position of the plasma treatment device is not particularly limited. For example, utilization of the plasma treatment device 40 provided between the first heating chamber 31 and the first film formation chamber 41 makes it possible to subject the substrate 10 to the plasma treatment before film formation in the first film formation chamber 41. In addition, utilization of the plasma treatment device 40' provided between the second film formation chamber 42 and the second heating chamber 32 makes it possible to subject the substrate 10 to the plasma treatment before annealing treatment etc. in the second heating chamber 32. Alternatively or additionally, a plasma treatment device may be provided, for example, between the first film formation chamber 41 and the second film formation chamber 42, according to need. However, the plasma treatment device is not necessarily required.

It is only necessary to provide at least two film formation chambers. However, an additional film formation chamber may be provided. An installation position of the additional film formation chamber is not particularly limited as long as it is located between the first roll chamber W1 and the second roll chamber W2. For example, the additional film formation chamber may be provided between the heating chamber 31 and the first film formation chamber 41. A material of a film to be formed in each of the film forming chambers is not particularly limited. For example, it may be a metal such as copper, copper alloy, silver or silver alloy, or a transparent conducting layer. The silver alloy may be a so-called APC (Ag—Pd—Cu) alloy prepared by adding palladium (Pd) and copper (Cu) to silver (Ag). In this case, silver may be contained in an amount of 90 atomic % as a primary component of the APC alloy.

The first film formation chamber 41 comprises a first rotary drum 51 and a first cathode electrode 61. The first rotary drum 51 is adapted to be bi-directionally rotatable to feed the substrate 10 in a selected one of the first direction A and the second direction B, so that the substrate 10 is fed in the selected one of the first direction A and the second direction B via a periphery of the first rotary drum 51. The first rotary drum 51 may have a function of heating the substrate 10. An effect to be obtained by the heating function of the first rotary drum 51 may be considered to be equal to that of the heating chamber. Therefore, the first rotary drum 51 may be used as a substitute for the heating function of the heating chamber. Conversely, the heating function of the heating chamber may be substituted for the heating function of the first rotary drum 51.

The first cathode electrode 61 consists of a plurality of electrode elements provided with respect to the first rotary drum 51. More specifically, each of the electrode elements of the first cathode electrode 61 is adapted to be movably disposed in opposed relation to the first rotary drum 51, while supporting a target for forming a film of a predetermined material. The predetermined material to be formed as a film may be freely selected depending on a usage mode of the film formation apparatus 1. For example, when the substrate 10 is passed around the first rotary drum 51 in the first direction A, the predetermined material may be set to a first material. The material may be freely changed depending on the usage mode of the film formation apparatus 1. During a period of time in which the substrate 10 is passed around the first rotary drum 51, a film of the predetermined material such as the first or third material will be formed on the substrate 10 using the first cathode electrode 61.

The second film formation chamber 42 has the same or similar configuration and functions as/to those of the first film formation chamber 41, and comprises a second rotary drum 52 and a second cathode electrode 62. The second rotary drum 52 is adapted to continuously feed the substrate 10 in a selected one of the first direction A and the second direction B via a periphery thereof, while heating the substrate 10. The second cathode electrode 62 consists of a plurality of electrode elements adapted to be disposed around and in opposed relation to the second rotary drum 52. The material in the second cathode electrode 62 may also be freely selected as the first cathode electrode 61. For example, a predetermined material of a target to be supported by the second cathode electrode 62 may be set to a second material when the substrate 10 is passed around the second rotary drum 52 in the first direction, and may be set to a fourth material when the substrate 10 is passed around the second rotary drum 52 in the second direction. The second material and the fourth material may be freely changed depending on the usage mode of the film formation apparatus 1. During a period of time in which the substrate 10 is passed around the second rotary drum 52, a film of the predetermined material will be formed on the substrate 10 using the second cathode electrode 62.

The heating in each of the first and second rotary drums 51, 52 and the film formation are mutually independent functions. Thus, for example, the film formation apparatus 1 can be controlled such that the first film formation chamber 41 performs only the heating, and the second film formation chamber 42 performs only the film formation. With a view to allowing the heating to be sufficiently performed, each of the first and second rotary drums 51, 52 may be configured to have a relatively large diameter and thereby increase a feeding time with respect to the substrate 10.

Figure 2:
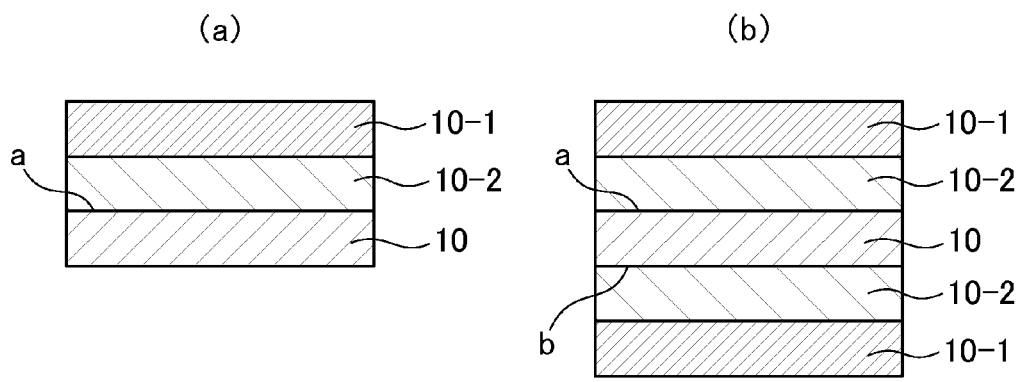
FIG. 2 is a schematic diagram illustrating an example structure of a laminate obtained by the film formation method according to the present invention.

With reference also to FIG. 2, one example of this film formation method using the film formation apparatus 1 will now be described below. In this film formation method, same treatments are repeated at least twice, but the surface for film formation is reversely set in each of these treatments. For convenience, each of these treatments will be referred to as a first treatment and a second treatment. FIGS. 2(*a*) and (*b*) respectively illustrate a laminate obtained after completion of the first treatment, i.e. an intermediate process, and a laminate obtained after completion of the second treatment, i.e. a final process.

In the first treatment, firstly, the substrate 10 is unrolled and fed from the first roll chamber W1 in the first direction A using one surface a (referred to as "first surface", for convenience) as a surface for film formation. The fed substrate 10 is degassed using a heating function of the first heating chamber 31 or the first rotary drum 51 of the first film formation chamber 41. Subsequently, a second material film 10-2 is formed on the first surface a of the substrate 10 that has been degassed in the first heating chamber 31 or is being degassed using the first rotary drum 51 of the first film formation chamber 41, using the second cathode electrode 62 of the second film formation camber 42, and then the substrate 10 is once rolled up in the second roll chamber W2. The rolled substrate 10 is then unrolled and fed from the second roll chamber W2 in the second direction B in a continuous state without changing the surface for film formation. Thereafter, a first material film 10-1 is formed on the first surface a of the fed substrate 10, using the first cathode electrode 61 of the first film formation camber 41, and then the substrate 10 is rolled up again in the first roll chamber W1. As a result, a laminate shown in FIG. 2(*a*), namely a laminate comprising the second material film 10-2 and the first material film 10-1 laminated in this order on the substrate 10 is obtained.

In the subsequent second treatment, the same treatment as the first treatment is repeated. However, before starting the treatment, it is required to once remove the substrate 10 from the first roll chamber W1 and reset it in the first roll chamber W1 to allow the second surface b opposite the first surface a to be used as the surface for film formation. These operations are performed in a state where a part of the substrate 10 is communicated with a load lock mechanism 13 provided between the first roll chamber W1 and an adjacent chamber to the first roll chamber, such as the heating chamber 31, while shielding between the first roll chamber W1 and the first heating chamber 31 by the load lock mechanism 13. This makes it possible to maintain all the chambers other than the first roll chamber W1 in a vacuum state during the above operation, and eliminate the need to bring the entire film formation apparatus 1 again in a vacuum state after the operation, reducing the hours of operation and enhancing efficiency of the film formation operation.

After setting the second surface b as the surface for film formation in the first roll chamber W1, the substrate 10 is fed from the first roll chamber W1 in the first direction A and degassed using a heating function of the first heating chamber 31 or the first rotary drum 51 of the first film formation chamber 41. Subsequently, a second material film 10-2 is formed on the second surface b of the degassed substrate 10, using the second cathode electrode 62 of the second film formation camber 42, and then the substrate 10 is once rolled up in the second roll chamber W2. The rolled substrate 10 that is then unrolled and fed from the second roll chamber W2 in the second direction B in a continuous state without changing the surface for film formation. Thereafter, a first material film 10-1 is formed on the second surface b of the fed substrate 10, using the first cathode electrode 61 of the first film formation camber 41, and then the substrate 10 is rolled up again in the first roll chamber W1.

From the above processes, the laminate shown in FIG. 2(*b*), namely a laminate comprising the second material film 10-2 and the first material film 10-1 respectively laminated in this order on the first surface a and the second surface b of the substrate 10 is obtained. The first and second materials are not particularly limited. For example, the first material film 10-1 may be made of a metal, such as copper (Cu), copper alloy, silver (Ag) or silver alloy (e.g., APC alloy), and the second material film 10-2 may be made of a transparent conducting layer, such as ITO. In the case where the first material film 10-1 is made of a metal, this metallic material would block the heating of the ITO constituting the second material film 10-2. Therefore, particularly in this case, it is preferable to subject the substrate 10 to a heating treatment in the second heating chamber 32 or the second film formation chamber 42, in other words, to an annealing treatment in a period after the second material film 10-2 is formed and before the first material film 10-1 is laminated. Moderate heating of the ITO in these heating chambers makes it possible to appropriately control the crystal condition to provide an amorphous or crystalline ITO in an optimal condition. In the above embodiment, description has been made based on a method of producing a laminate on both sides of the substrate 10. However, it is to be understood that the film formation treatment may be further repeated on both sides or one side of the substrate 10.

Figure 3:
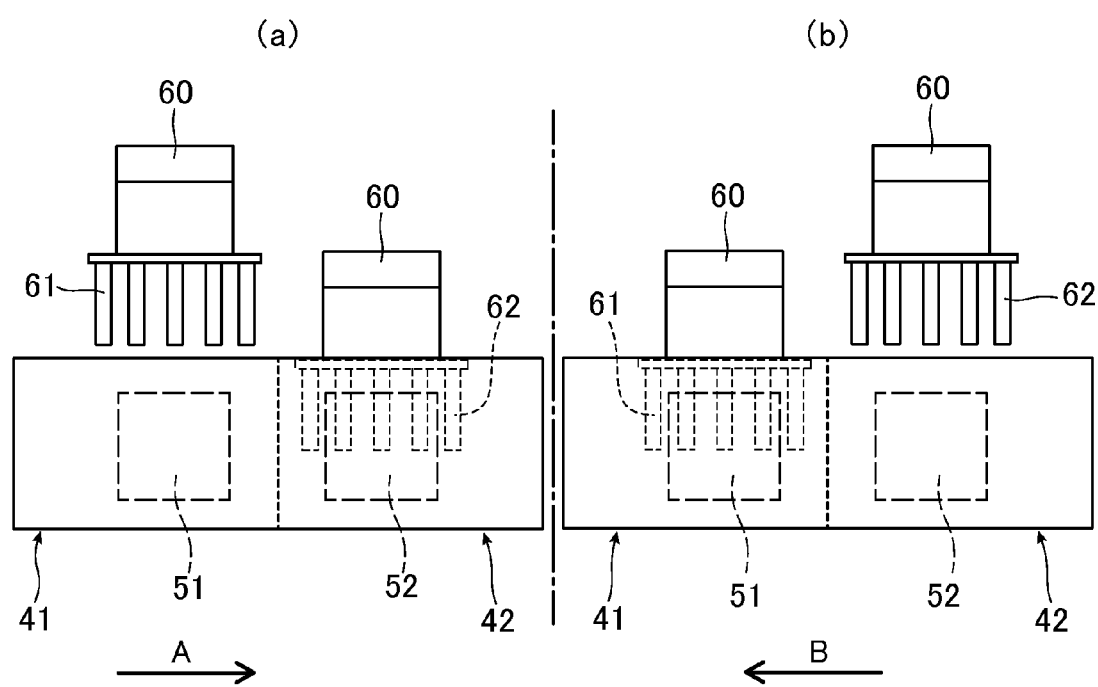
FIG. 3 is a schematic diagram illustrating an arrangement of a cathode electrode achievable by the film formation method according to the present invention.

With Reference to FIG. 3, an arrangement of a cathode electrode achievable by the present film formation method will now be described below. FIG. 3(*a*) is a schematic plan view illustrating respective arrangements of the first cathode electrode 61 of the first film formation chamber 41 and the second cathode electrode 62 of the second film formation chamber 42, to be achieved when a film is formed on the substrate 10 being fed in the first direction A, and FIG. 3(*b*) is a schematic plan view illustrating respective arrangements of the first cathode electrode 61 of the first film formation chamber 41 and the second cathode electrode 62 of the second film formation chamber 42, to be achieved when a film is formed on the second substrate being fed in the second direction B.

Obviously, when the second material film 10-2 is formed in the second film formation chamber 42, all that is necessary for the first film formation chamber 41 is that the first rotary drum 51 of the first film formation chamber 41 can perform heating (degassing), but it is not necessary to perform film formation using the first cathode electrode 61. Thus, the degassing or the like in the first film formation chamber 41 may be performed in a state where the first cathode electrode 61 is removed from the first film formation chamber 41, for example, by moving an electrode body 60 supporting the first cathode electrode 61, as illustrated in FIG. 3(*a*). As a result, the first cathode electrode 61 removed from the first film formation chamber 41 can be subjected to maintenance such as replacement, and the film formation in the second film formation chamber 42 can be continuously performed even during the maintenance, so that it becomes possible to increase production efficiency of the substrate 10. An opening of the first film formation chamber 41 for allowing the first cathode electrode 61 to be removed from the first film formation chamber 41 therethrough may be closed by a temporary cover or the like, if necessary.

Similarly, when the first material film 10-1 is formed in the first film formation chamber 41, all that is necessary for the second film formation chamber 42 is that the second rotary drum 52 of the second film formation chamber 42 can perform heating (degassing), but it is not necessary to perform film formation using the second cathode electrode 62. Thus, the degassing or the like in the second film formation chamber 42 may be performed in a state where the second cathode electrode 62 is removed from the second film formation chamber 42, as illustrated in FIG. 3(*b*). As a result, the second cathode electrode 62 removed from the second film formation chamber 42 can be subjected to maintenance such as replacement, and the film formation in the first film formation chamber 41 can be continuously performed even during the maintenance, so that it becomes possible to obtain the same effect as described above. An opening of the second film formation chamber 42 for allowing the second cathode electrode 62 to be removed from the second film formation chamber 42 therethrough may be closed by a temporary cover or the like, in the same manner as described above, if necessary.

In this film formation method, in a period after feeding from the first roll chamber W1 and before formation of the second material film 10-2 in the second film formation chamber 42, the substrate 10 can be subjected to a plasma treatment, using, for example, the plasma treatment device 40 provided between the heating chamber 31 and the first film formation chamber 41, and/or a plasma treatment device (not shown) provided between the first film formation chamber 41 and the second film formation chamber 42. Further, in a period after feeding from the second roll chamber W2 and before formation of the first material film 10-1 in the first film formation chamber 41, the substrate 10 can be subjected to a plasma treatment, using, for example, the plasma treatment device 40' provided between the second film formation chamber 42 and the second heating chamber 32, and/or a plasma treatment device (not shown) provided between the second film formation chamber 42 and the first film formation chamber 41. Such a plasma treatment makes it possible to effective perform the subsequent film formation.

In this film formation method, in a period after feeding from the first roll chamber W1 and before formation of the second material film 10-2 in the second film formation chamber 42, the substrate 10 can be subjected to degassing, using, for example, the first heating chamber 31 provided between the first roll chamber W1 and the first film formation chamber 41, a heating chamber (not shown) provided between the first film formation chamber 41 and the second film formation chamber 42, or even a heating function provided by the first rotary drum 51 of the first film formation chamber 41. Further, in a period after feeding from the second roll chamber W2 and before formation of the first material film 10-1 in the first film formation chamber 41, the substrate 10 can be subjected to degassing, using, for example, the second heating chamber 32 provided between the second film formation chamber 42 and the second roll chamber W2, a heating chamber (not shown) provided between the first film formation chamber 41 and the second film formation chamber 42, or a heating function provided by the second rotary drum 52 in the second film formation chamber 42.

Further, in a period after formation of the second material film 10-2 and before formation of the first material film 10-1 on the first surface a of the substrate 10, or in a period after formation of the second material film 10-2 and before formation of the first material film 10-1 on the second surface b of the substrate 10, the substrate 10 can be subjected to an annealing treatment, using, for example, the second heating chamber 32 provided between the second film formation chamber 42 and the second roll chamber W2. Similarly, in a period after formation of the first material film 10-1 on the second material film 10-2 on the first surface a of the substrate 10, or in a period after formation of the first material film 10-1 on the second material film 10-2 on the second surface b of the substrate 10, the substrate 10 can be subjected to an annealing treatment, using, for example, the first heating chamber 31 provided between the first roll chamber W1 and the first film formation chamber 41.

Figure 4:
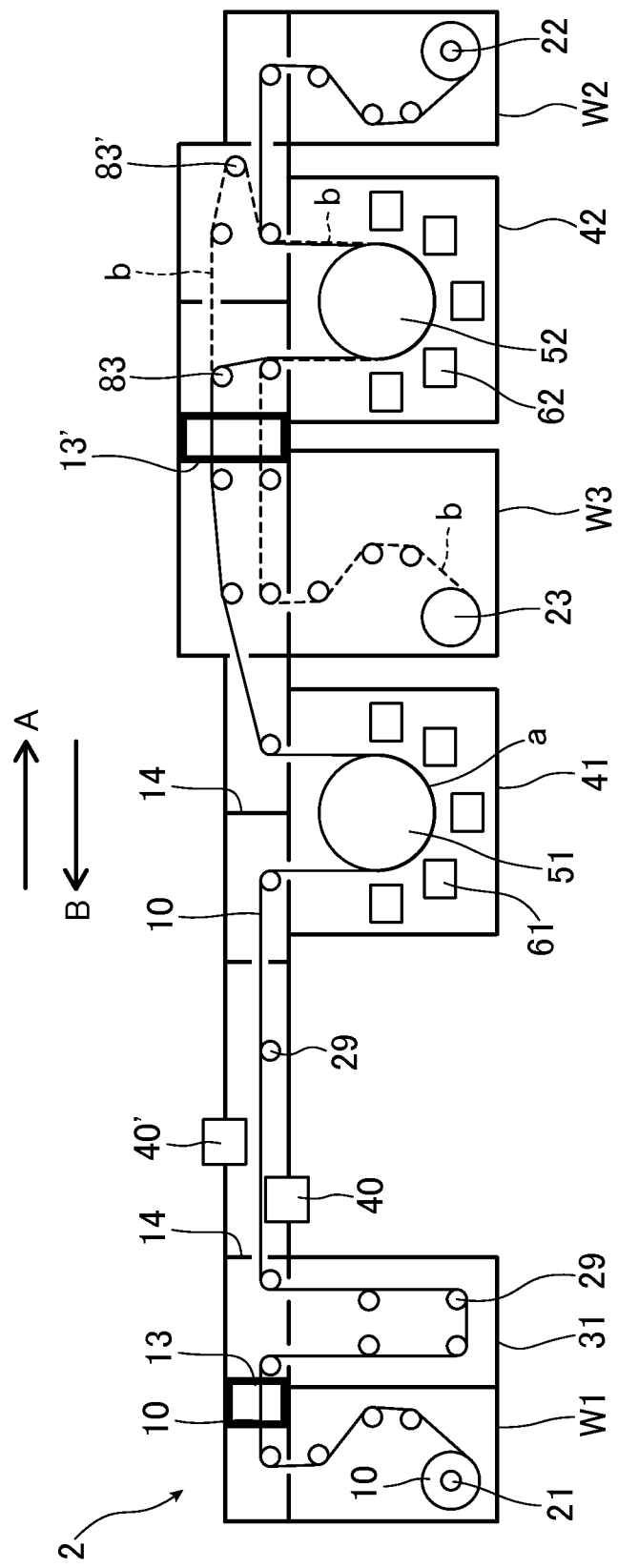
FIG. 4 is a schematic diagram illustrating another apparatus configuration capable of implementing a film formation method according to the present invention.

FIG. 4 illustrates another apparatus configuration 2 capable of implementing the present film formation method. In FIG. 4, the same element or component as in FIG. 1 is designated by the same reference numeral or code as that in FIG. 1. It is only necessary for the element or component constituting the film formation apparatus 2 to be arranged to allow the present film formation method to be implemented. Thus, the film formation apparatus 1 does not necessarily employ the configuration of FIG. 1, and for example, it may employ the configuration of FIG. 4.

For example, the film formation apparatus 2 comprises the first roll chamber W1 and the second roll chamber W2 of the film formation apparatus 1 as shown in FIG. 1, as well as a third roll chamber W3, an additional plasma treatment device 40' provided between the heating chamber 31 and the first film formation chamber 41, a load lock 13' provided between the third roll chamber W3 and the second film formation chamber 42, and switching rolls 83, 83' for changing paths for the substrate 10. However, the film formation apparatus 2 has the same basic configuration as the film formation apparatus 1, namely, for example, at least two film formation chambers are provided between each roll chamber, and thus the present film formation method may be implemented also by such a configuration.

For convenience, a feed path to which switching is performed by the switching roll 83' is referred to as "first feed path", while a feed path to which switching is performed by the switching roll 83 is referred to as "second feed path". As shown in FIG. 1, in a period after a substrate 10 is unrolled and fed in a first direction A from the first roll chamber W1 toward the second roll chamber W2 through until it reaches at least the switching roll 83, the substrate 10 moves along the common part regardless of the above feed paths. However, after reaching the switching roll 83, in the first feed path, the substrate 10 is turned around by the switching roll 83' and thereby fed to pass through the second film formation chamber 42 in the second direction B, as indicated by the broken line, whereas, in the second feed path, the substrate 10 is fed to pass through the second film formation chamber 42 in the first direction A, as indicated by the solid line. Obviously, when the present film formation method is implemented, the second feed path indicated by solid line is used. The detail of the film formation operation is as described above.

The above description has been made based on an example where two film formation chambers are provided. However, it is to be understood that a film formation apparatus comprising three or more film formation chambers can obtain the same effects. Further, as described in connection with the configurations of the first and second film formation apparatuses, a heating chamber or a plasma treatment device may be appropriately provided at an adequate position, and the film formation method of the present invention may be implemented in a film formation apparatus incorporating it.

The present invention includes these various changes and modifications encompassed within a technical scope thereof.

INDUSTRIAL APPLICABILITY

The method according to the present invention may widely be used for various types of film formation apparatus.

EXPLANATION OF CODES

1: film formation apparatus
10: substrate
13: load lock
14: partition
29: guide roll
31: heating chamber
40: plasma treatment device
41: first film formation chamber
42: second film formation chamber
51: first rotary drum
52: second rotary drum
60: main body
61: first cathode electrode
83: switching roll
W1: first roll chamber
W2: second roll chamber
W3: third roll chamber

What is claimed is:

1. A method for continuously subjecting an elongated substrate to vacuum film formation, comprising the steps of:
    a) unrolling and feeding an elongated substrate wound in a roll form from a first roll chamber in a first direction from the first roll chamber toward a second roll chamber, using a first surface as a surface for film formation;
    b) degassing the substrate fed in the first direction;
    c) forming, in a second film formation chamber, a second material film on the first surface of the degassed substrate;
    d) taking up, in the second roll chamber, the substrate in a roll form, the substrate having the second material film formed thereon;
    e) unrolling and feeding the substrate taken up in the second roll chamber from the second roll chamber in a second direction from the second roll chamber toward the first roll chamber;
    f) forming, in a first film formation chamber, a first material film on the second material film formed on the first surface of the substrate fed in the second direction;
    g) taking up, in the first roll chamber, the substrate in a roll form, the substrate having the first material film laminated on the second material film on the first surface thereof, wherein a second surface of the substrate, opposite the first surface, is free from material layers in the roll form;
    h) unrolling and feeding the substrate taken up in the first roll chamber from the first roll chamber in the first direction, using the second surface as a surface for film formation;
    i) degassing the substrate fed in the first direction;
    j) forming, in the second film formation chamber, the second material film on the second surface of the degassed substrate;
    k) taking up, in the second roll chamber, the substrate in a roll form, the substrate having the second material film formed thereon;
    l) unrolling and feeding the substrate taken up in the second roll chamber from the second roll chamber in the second direction;
    m) forming, in the first film formation chamber, the first material film on the second material film formed on the second surface of the substrate fed in the second direction; and
    n) taking up, in the first roll chamber, the substrate in a roll form, the substrate having the first material film laminated on the second material film on each of the first and second surfaces thereof.

2. The method as defined in claim 1, wherein when unrolling and feeding the substrate from the first roll chamber in the first direction using a second surface of the substrate as a surface for film formation, the second surface of the substrate is set as a surface for film formation in a state where a part of the substrate is communicated with a load lock mechanism provided between the first roll chamber and an adjacent chamber to the first roll chamber while shielding between the first roll chamber and the adjacent chamber using the load lock mechanism.

3. The method as defined in claim 1, wherein the substrate is subjected to a plasma treatment in a period after it is fed from the first roll chamber and before the second material film is formed thereon.

4. The method as defined in claim 1, wherein the substrate is subjected to a plasma treatment in a period after it is fed from the second roll chamber and before the first material film is formed thereon.

5. The method as defined in claim 1, wherein the substrate is degassed in a heating chamber in a period after it is fed from the first roll chamber and before the second material film is formed thereon.

6. The method as defined in claim 1, wherein the substrate is degassed in a heating chamber in a period after it is fed from the second roll chamber and before the first material film is formed thereon.

7. The method as defined in claim 1, wherein the substrate is degassed in the first film formation chamber when it is being guided in the first direction.

8. The method as defined in claim 1, the substrate is degassed in the second film formation chamber when it is being guided in the second direction.

9. The method as defined in claim 1, wherein when forming, in the second film formation chamber, the second material film on the substrate fed in the first direction, a first cathode electrode in the first film formation chamber is removed from the first film formation chamber.

10. The method as defined in claim 1, wherein when forming, in the first film formation chamber, the first material film on the second material film formed on the substrate fed in the second direction, a second cathode electrode in the second film formation chamber are removed from the second film formation chamber.

11. The method as defined in claim 1, wherein the substrate is subjected to an annealing treatment in a period after the second material film is formed and before the first material film is laminated on the first surface thereof, or in a period after the second material film is formed and before the first material film is laminated on the second surface thereof.

12. The method as defined in claim 1, wherein the substrate is subjected to an annealing treatment after the first material film is laminated on the second material film on the first surface, or after the first material film is laminated on the second material film on the second surface thereof.

13. The method as defined in claim 1, wherein the first material is a metal and the second material is a transparent conducting layer.

14. The method as defined in claim 13, wherein the metal is selected from a group consisting of copper, a copper alloy, silver and a silver alloy.

* * * * *